United States Patent
Donachy et al.

(10) Patent No.: US 11,886,249 B2
(45) Date of Patent: *Jan. 30, 2024

(54) DYNAMIC INFORMATION TAG

(71) Applicant: Dell Products L.P., Round Rock, TX (US)

(72) Inventors: John C. Donachy, Austin, TX (US); Richard A. Crisp, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 244 days.

This patent is subject to a terminal disclaimer.

(21) Appl. No.: 17/383,570

(22) Filed: Jul. 23, 2021

(65) Prior Publication Data

US 2023/0022837 A1 Jan. 26, 2023

(51) Int. Cl.
*G06F 1/00* (2006.01)
*G06F 1/16* (2006.01)

(52) U.S. Cl.
CPC .......... *G06F 1/1652* (2013.01); *G06F 1/1607* (2013.01); *G06F 1/1615* (2013.01)

(58) Field of Classification Search
CPC ..... G06F 1/1652; G06F 1/1607; G06F 1/1615
See application file for complete search history.

(56) References Cited

U.S. PATENT DOCUMENTS

| 10,251,303 | B2 | 4/2019 | Hartman et al. |
| 10,936,381 | B1 | 3/2021 | Poblete et al. |

| 2009/0243873 | A1 | 10/2009 | Mizukawa et al. |
| 2013/0069781 | A1 | 3/2013 | Terwilliger et al. |
| 2014/0253289 | A1 | 9/2014 | Groth et al. |
| 2016/0071494 | A1 | 3/2016 | Hwang |
| 2016/0104397 | A1 | 4/2016 | Kim et al. |
| 2016/0182130 | A1* | 6/2016 | Ahmed ................ H04B 5/0031 455/41.1 |
| 2017/0046242 | A1* | 2/2017 | Ragupathi ........... G06F 11/3044 |
| 2020/0349505 | A1* | 11/2020 | Coleman .......... G06K 19/06028 |
| 2021/0035509 | A1* | 2/2021 | Hu ....................... G08B 21/182 |

OTHER PUBLICATIONS

R. Lai, Engadget, Rimowa's electronic luggage tag is the future of traveling, Jul. 7, 2016.
IBM, Light Path Diagnostics, https://systemx.lenovofiles.com/help/index.jsp?topic=%2Fcom.lenovo.sysx.7383.doc%2Fc_light_path_diagnostics.html, downloaded from the internet Jul. 23, 2021.

* cited by examiner

*Primary Examiner* — Pete T Lee
(74) *Attorney, Agent, or Firm* — Terrile, Cannatti & Chambers; Stephen A. Terrile

(57) ABSTRACT

A dynamic information tag is disclosed for performing a dynamic information tag operation. The dynamic information tag includes a tag housing, the tag housing being sized to fit within a recess of an information handling system configured for receipt of a static information tag; a control and connection portion; and, a display coupled to the control and connection portion, the display being controlled via the control and connection portion to present information handling system information.

10 Claims, 21 Drawing Sheets

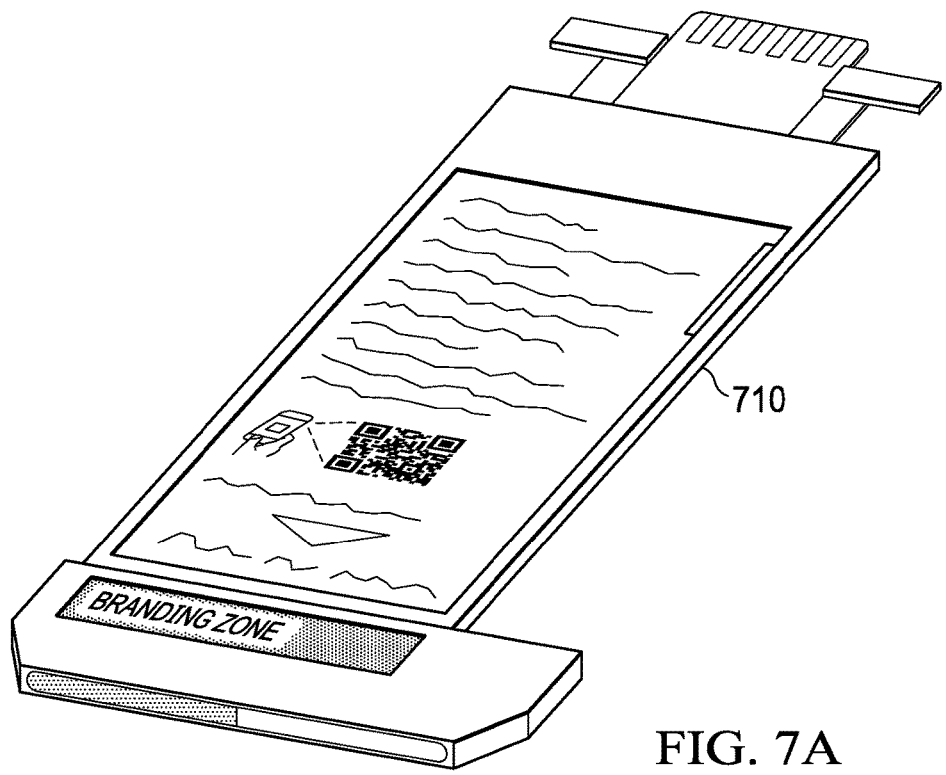
FIG. 7A
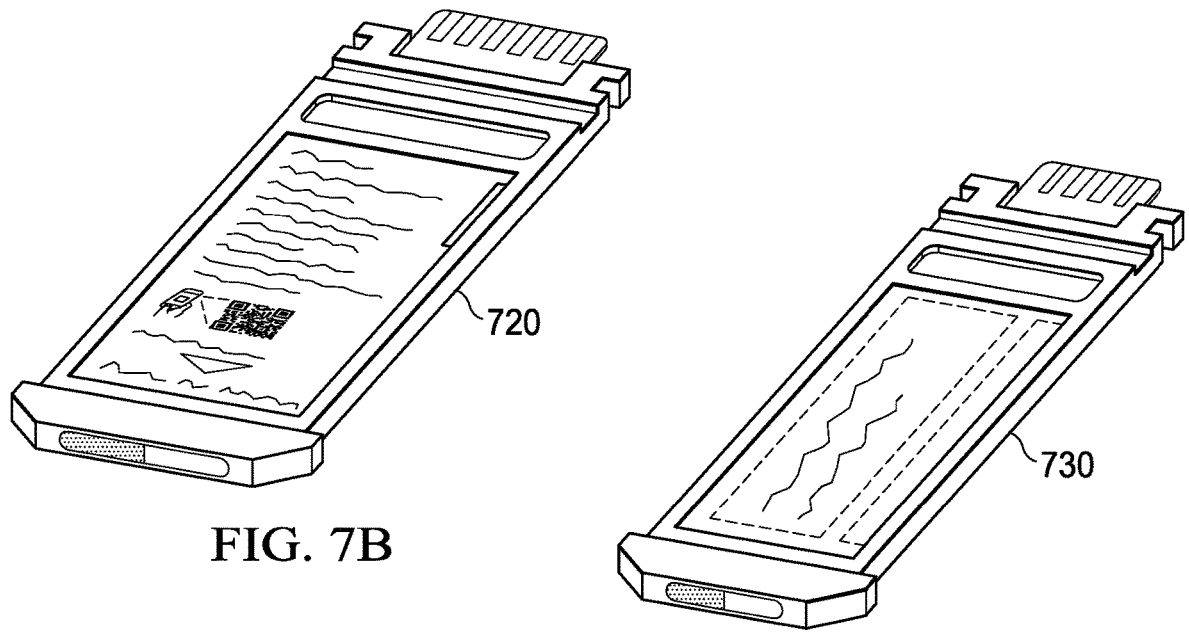
FIG. 7B
FIG. 7C

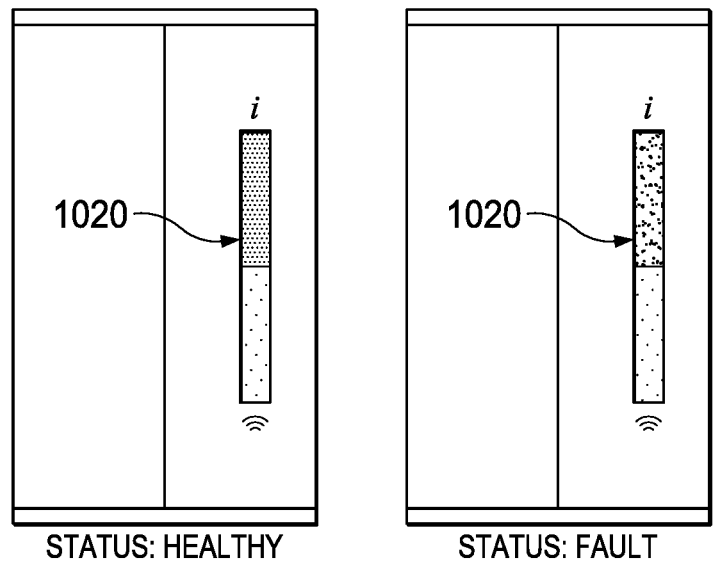
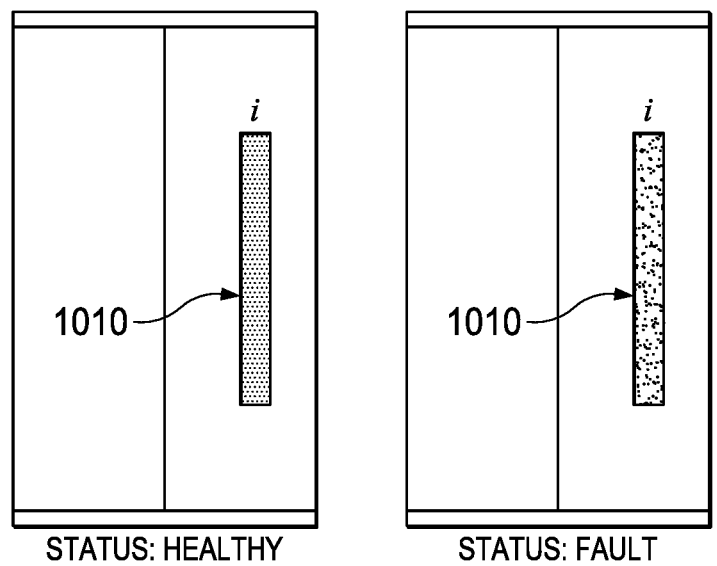
FIG. 10

| LEFT EAR LED STATE | LED BEHAVIOR(S) | RIGHT ALT LED STATE | LED BEHAVIOR(S) | VISUAL REFERENCE |
|---|---|---|---|---|
| OK (1) | (ALL) ON SOLID BLUE | OK (1) | (ALL) ON SOLID BLUE | 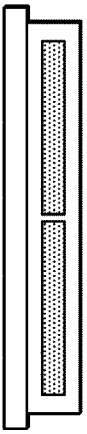 |
| OK (2) | (TOP HALF) ON SOLID BLUE | OK (2) | (LEFT LENS) ON SOLID BLUE | 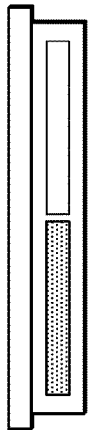 |
| FAULT | (ALL) BLINKING AMBER 2 SECONDS ON, 1 SECOND OFF | FAULT | (ALL) BLINKING AMBER 2 SECONDS ON, 1 SECOND OFF | 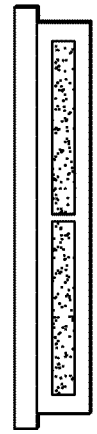 |
| QUICK SYNC ACTIVATED WHILE SYSTEM FAULTED | (TOP HALF) BLINKING AMBER 2 SECONDS ON, 1 SECOND OFF; (BOTTOM HALF) SOLID WHITE | QUICK SYNC ACTIVATED WHILE SYSTEM FAULTED | (LEFT LENS) BLINKING AMBER 2 SECONDS ON, 1 SECOND OFF; (RIGHT LENS) SOLID WHITE | 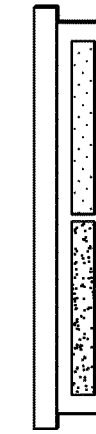 |
| QUICK SYNC ACTIVATED WHILE SYSTEM OK | (TOP HALF) SOLID BLUE; (BOTTOM HALF) SOLID WHITE | QUICK SYNC ACTIVATED WHILE SYSTEM OK | (LEFT LENS) SOLID BLUE; (RIGHT LENS) SOLID WHITE | 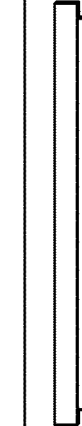 |

FIG. 11A

| RIGHT ALT LED STATE | LED BEHAVIOR(S) | VISUAL REFERENCE | | | | | | | |
|---|---|---|---|---|---|---|---|---|---|
| FAULT (A) | (LED 1, 2) BLINKING AMBER 2 SECONDS ON, 1 SECOND OFF | ▨ | ▨ | □ | □ | □ | □ | □ | □ |
| FAULT (B) | (LED 3, 4) BLINKING AMBER 2 SECONDS ON, 1 SECOND OFF | □ | □ | ▨ | ▨ | □ | □ | □ | □ |
| FAULT (A, C) | (LED 1, 2, 5, 6) BLINKING AMBER 2 SECONDS ON, 1 SECOND OFF | ▨ | ▨ | □ | □ | ▨ | ▨ | □ | □ |
| LOCATE (A) | (ALL CYCLING "IN PAIRS" AND IN SERIES) 0.3 SECONDS ON, CYCLING BLUE: 1, 2 + 7, 8 BLINK > 2, 3 + 6, 7 BLINK > 3, 4 + 5, 6 ETC. | ▨ | ▨ | ▨ | ▨ | ▨ | ▨ | ▨ | ▨ |

FIG. 11B

DYNAMIC INFORMATION TAG

BACKGROUND OF THE INVENTION

Field of the Invention

The present invention relates to information handling systems. More specifically, embodiments of the invention relate to providing information handling systems with dynamic information tags.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY OF THE INVENTION

In one embodiment the invention relates to a dynamic information tag comprising a tag housing, the tag housing being sized to fit within a recess of an information handling system configured for receipt of a static information tag; a control and connection portion; and, a display coupled to the control and connection portion, the display being controlled via the control and connection portion to present information handling system information.

In another embodiment the invention relates to a system comprising: a processor; a data bus coupled to the processor; and dynamic information tag comprising a tag housing, the tag housing being sized to fit within a recess of an information handling system configured for receipt of a static information tag; a control and connection portion; and, a display coupled to the control and connection portion, the display being controlled via the control and connection portion to present information handling system information.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 7A, 7B and 7C show respective perspective views of a plurality of dynamic information tag form factors.

FIG. 10 shows a front view of a plurality of behavior indicators presented via a dynamic information tag.

FIGS. 11A and 11B show tables of a plurality of behavior indicators presented via a dynamic information tag.

DETAILED DESCRIPTION

Figure 1:
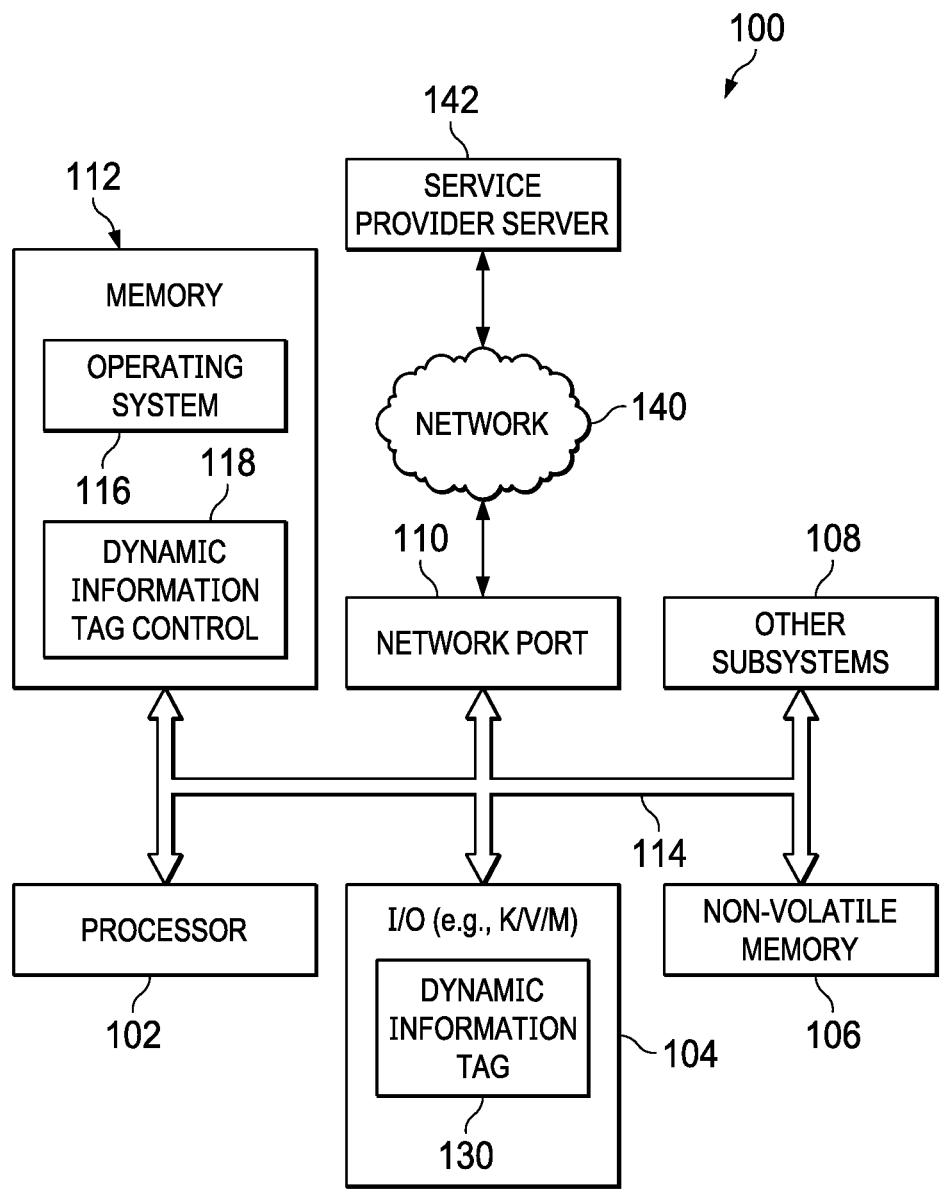
FIG. 1 shows a general illustration of components of an information handling system as implemented in the system and method of the present invention.

Certain aspects of the present disclosure reflect an appreciation that server and storage type information handling system front end area use is at a premium. There is limited room for user interaction zones and the space available is valuable for provision of server "payloads" such as hard drives and peripherals. Certain aspects of the present disclosure reflect an appreciation that customers often value displays which can help users diagnose issues which are accessible via the front end of the server. Certain known server type information handling systems provide a bezel with a display (located on the left or right edge of the bezel (e.g., the ears of the bezel). Certain known server type information handling systems the display is touch sensitive.

Certain aspects of the present disclosure include an appreciation that as data center hardware continues to evolve, available real-estate on the front and rear of these solutions becomes more scarce.

Certain aspects of the present disclosure include an appreciation that procurement of part, label and printing systems is necessary for every manufacturing location that is responsible for the assembly of the server and storage type information handling platforms. With certain systems the labeling can require production and handling of three to four reserved locations on the front and rear portions of each system.

This production and handling can include costly manual handling for part tracking and addition of these unique labels for each platform throughout the build cycle of the system. Certain aspects of the present disclosure include an appreciation that it is often desirable to identify the brand/sub-brand of a particular server type information handling system. Certain known server type information handling systems provide a pull tag with printed information that is accessed via the front of system.

Certain aspects of the present disclosure reflect an appreciation that it is desirable to able identify each different product through branding and other customizations each server or storage system depends upon to give it its own unique value and purpose to fulfill. Certain aspects of the present disclosure reflect an appreciation that identification of different products can be more challenging when the products are developed using a common compute framework (CCF) for shared server and storage hardware solutions. Such a CCF provides many advantages such as economies of scale, reduction of the amount of needed hardware development and consistent experiences for end users.

Additionally, certain aspects of the present disclosure reflect an appreciation that it is desirable to be able to rebrand a compute device such as when an equipment reseller wishes to resell hardware as a unique solution for their customers. With known systems, to brand or rebrand hardware, printed model numbers may be affixed onto free space on the device. With certain known systems the printed information may be affixed to a pull tag which is integrated into the compute device.

Certain aspects of the present disclosure include an appreciation that when a server or storage device encounters a failure it is important for an operator to quickly identify what the issue is to get the unit back online as quickly as possible. Known systems use many techniques to help users solve the issue. For example, systems may include LED indicators as well as System Information Labels (SIL) to aid users. System Information Labels can be valuable to users because they offer "always available" references for configurations and contain step by step information on how to interact with the device. However, issues with system information labels include they are expensive to procure, require management to install, and often force the hardware configuration to be "locked" to the data presented on the label. If the hardware changes to a different configuration, new labels much be purchased, and operators must attempt to remove the existing label without damaging sheet metal.

A dynamic information tag and a system, method, and computer-readable medium for a controlling a dynamic information tag are disclosed. In certain embodiments, the dynamic information tag provides a mechanism that moves control panel interaction zones from left or right rack edges to an area of the server which has traditionally been under-utilized. Such a dynamic information tag enables maximum payload space for all server type information handling system architectures. Such a dynamic information tag does not sacrifice the user experience and consumes less space across the front of the server type information handling system. Such a dynamic information tag reduces complexity of rack edge designs. Such a dynamic information tag provides a slim display panel which is positioned along the chassis floor of a server type information handling system.

Such a dynamic information tag provides a plurality of functions including hardware branding and/or sub-branding (such as hardware type and model/series identification), platform and node behavior identification (e.g., via single and bi-color embedded LEDs), service and/or warranty information (which can include at-the-box technical publication repository portal access).

Such a dynamic information tag can provide platform and/or node behavior identification which includes a system health indication. In certain embodiments, such a dynamic information tag includes a system health indicator which facilitates locating a particular system within a data center. Such a dynamic information tag facilitates a determination of the health of a system which is visible from the front of the platform.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

FIG. 1 is a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, a touchpad or touchscreen, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116 and in various embodiments may also comprise dynamic information tag control system 118. In one embodiment, the information handling system 100 is configured to download the dynamic information tag control system 118 from the service provider server 142. In another embodiment, the dynamic information tag control system 118 is provided as a service from the service provider server 142. In certain embodiments, the I/O devices 104 include a dynamic information tag 130.

The dynamic information tag control system performs a dynamic information tag control operation. In certain embodiments, the dynamic information tag control operation interacts with and controls a dynamic information tag 130 during operation of an information handling system 100. In certain embodiments, the dynamic information tag control operation includes an ability to dynamically present information.

Figure 2:
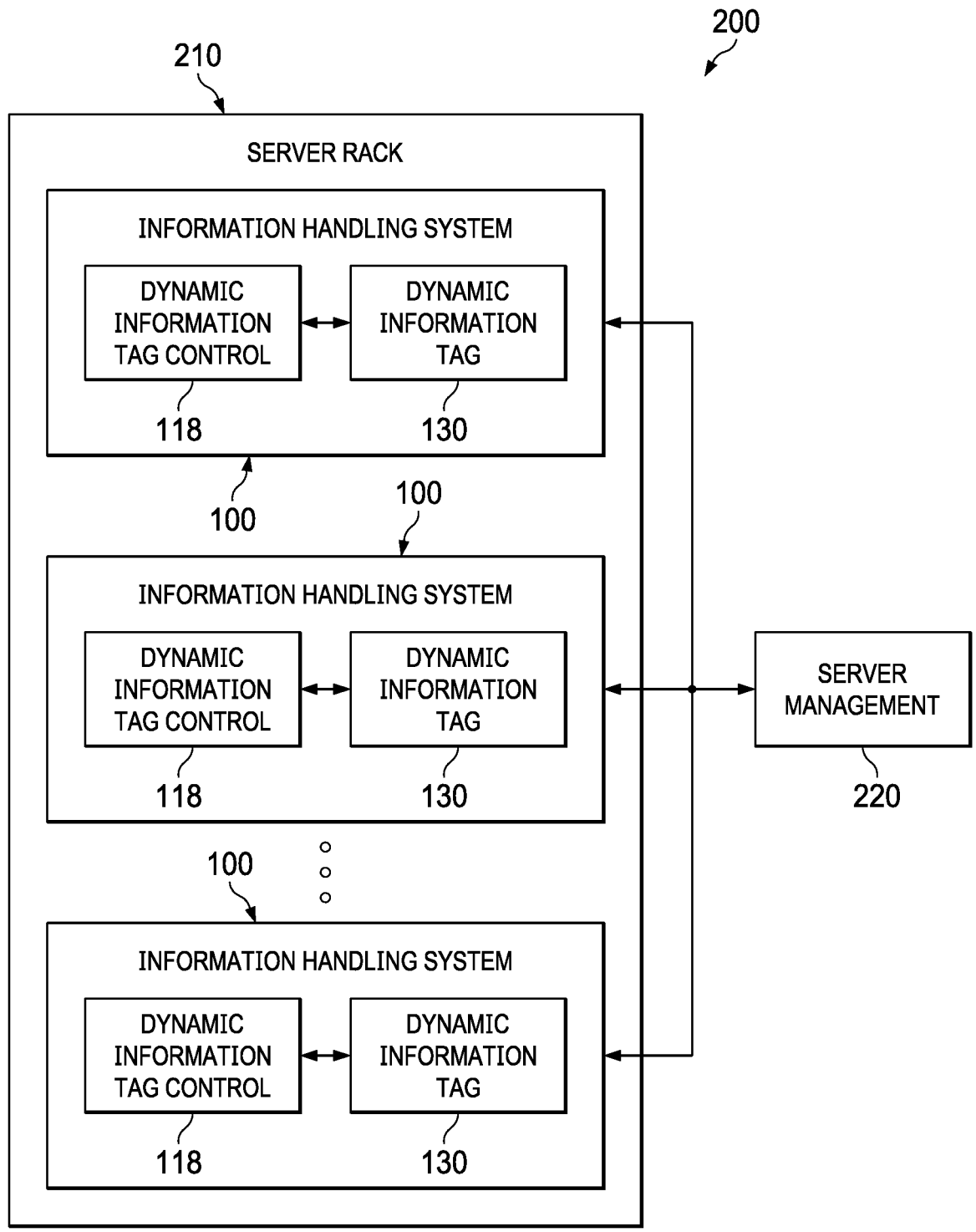
FIG. 2 shows a block diagram of a server rack having a plurality of information handling systems.

FIG. 2 shows a block diagram of a server environment 200 having a plurality of server type information handling systems. In certain embodiments, the server environment 200 includes one or more server racks 210. In certain embodiments, the server racks 210 maybe located within a data center. In certain embodiments, each server type information handling system corresponds to an information handling system 100. Some or all of the information handling systems 100 include a respective dynamic information tag 130 and dynamic information tag control system 118. In certain embodiments, the dynamic information tag control system receives information from a server management system 220.

As used herein, a data center broadly refers to a building, a dedicated space within a building, or a group of buildings, used to house a collection of interrelated data center assets implemented to work in combination with one another for a particular purpose. As likewise used herein, a data center asset broadly refers to anything tangible, or intangible, that can be owned, controlled, or enabled to produce value as a result of its use within a data center. In certain embodiments, a data center asset may include a product, or a service, or a combination of the two. In certain embodiments, a data center asset includes an information handling system.

Figure 3:
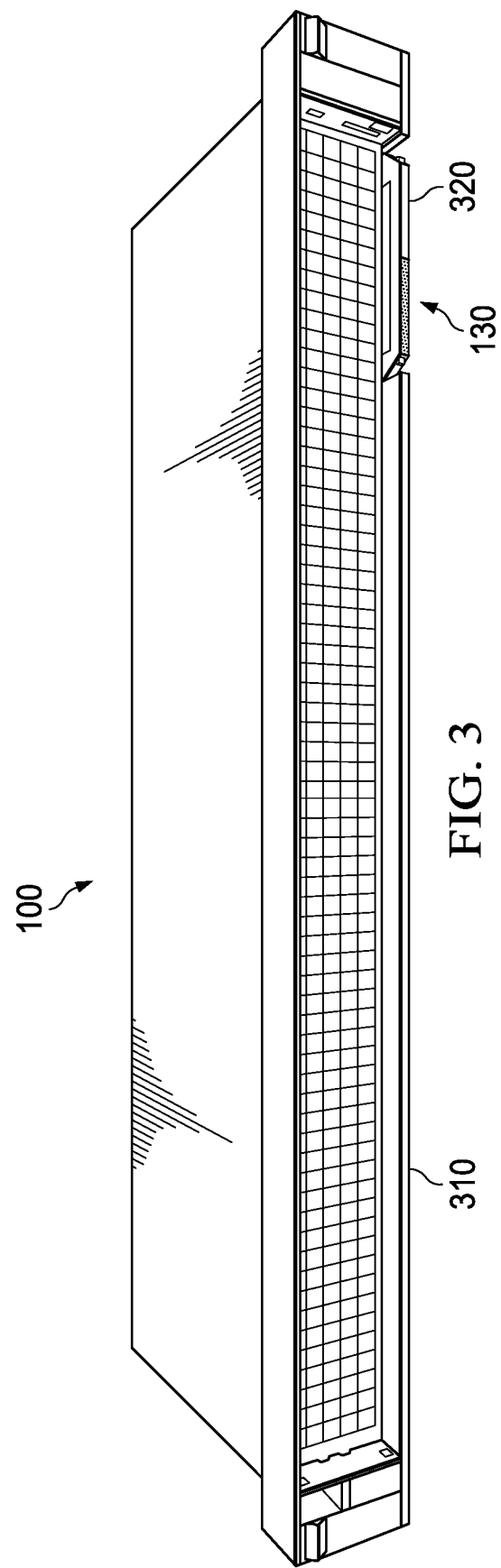
FIG. 3 shows a perspective view of an information handling system having a dynamic information tag.

FIG. 3 shows a perspective view of an information handling system 100 having a dynamic information tag 130. As used herein, a tag broadly refers to a device attached to an asset such as an information handling system for the purpose of providing information regarding the attached asset. As used herein, a dynamic information tag broadly refers to a tag where the provided information may be changed. In certain embodiments, the dynamic information tag 130 includes a behavior indication portion 320.

In certain embodiments, the dynamic information tag 130 is fit within a recess defined by the information handling system 100. In certain embodiments the recess is provided by creating a void where a portion of the front edge (which may be composed of sheet metal) of the information handling system is folded back to provide a space between device components into which the dynamic information tag 130 fits. In certain embodiments, the behavior indication portion 320 is visible when the dynamic information tag is in closed position. In certain embodiments, the recess is positioned along an edge of a front portion of the information handling system 100. In certain embodiments, the edge is a substantially bottom edge (i.e., within 15% of the bottom) of the front portion of the information handling system. In certain embodiments, the recess is located close to a lower right corner of the information handling system. In certain embodiments, the dynamic information tag 130 is presented as a substantial continuation of a portion of a bezel (i.e., having less than a 5 mm gap from the bezel) of the front portion of the information handling system. In certain embodiments, the dynamic information tag 130 provides a slim form factor (e.g., minimal Z height (e.g., less than 3 mm+/−10%)) solution for providing information handling system information.

In certain embodiments, the dynamic information tag 130 provides a mechanism that moves control panel interaction zones from left or right rack edges to an area of the server which has traditionally been underutilized. Such a dynamic information tag 130 enables maximum payload space for all server type information handling system architectures. Such a dynamic information tag 130 does not sacrifice the user experience and consumes less space across the front of the server type information handling system. Such a dynamic information tag 130 reduces complexity of rack edge designs. Such a dynamic information tag 130 provides a slim display panel which is positioned along the chassis floor of a server type information handling system.

Such a dynamic information tag 130 provides one or more of a plurality of functions including hardware branding and/or sub-branding (such as hardware type and model/series identification), platform and node behavior identification (e.g., via single and bi-color embedded LEDs), service and/or warranty information (which can include at-the-box technical publication repository portal access).

Such a dynamic information tag 130 can provide platform and/or node behavior identification which includes a system health indication. In certain embodiments, such a dynamic information tag 130 includes a system health indicator which facilitates locating a particular system within a data center. Such a dynamic information tag 130 facilitates a determination of the health of a system which is visible from the front of the platform.

Figure 4:
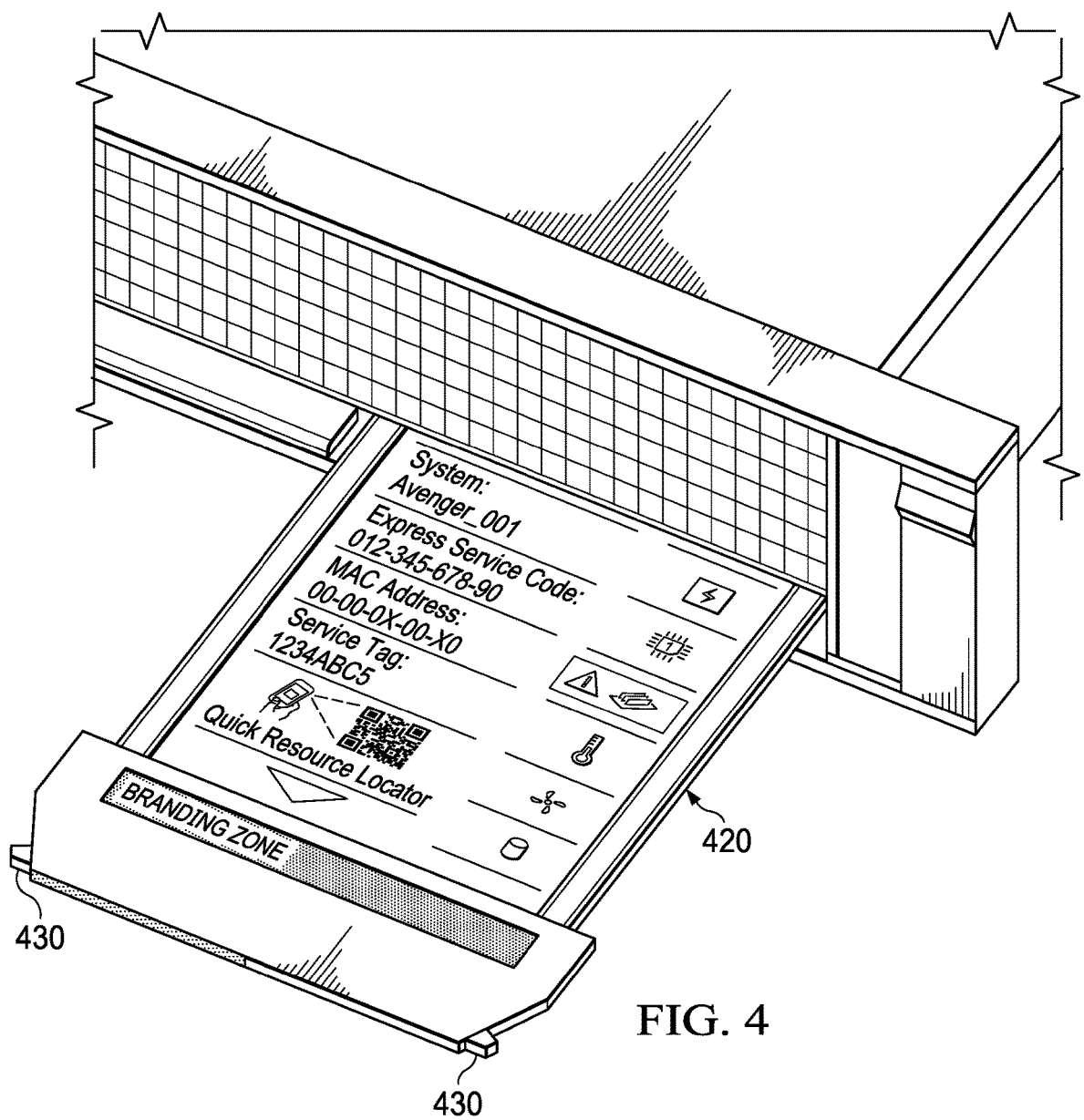
FIG. 4 shows a perspective view of an information handling system having a dynamic information tag in an extended configuration.

FIG. 4 shows a perspective view of an information handling system having a dynamic information tag in an open configuration. When the dynamic information tag 130 is in the open configuration, the dynamic information tag 130 extends from a side of the information handling system 100. In certain embodiments, the dynamic information tag 130 extends from a front side of the information handling system. When the dynamic information tag is in an open configuration, additional information is visible on the dynamic information tag 130.

In certain embodiments, the dynamic information tag 130 is pulled from a closed configuration to the open configuration when a user desires interaction with the dynamic information tag 130. When in the open configuration, the dynamic information tag 130 provides a display portion 420. This display zone is provided only using a space which had previously been reserved for a static tag solution. Accordingly, no additional area of the front of the information handing system is required. Such a dynamic information tag 130 can provide the information without a need for a specialized bezel containing information presentation functionality. Such a dynamic information tag 130 allows the information to be provided in a zone of the front of the information handling system which relieves real estate pressure on the rack ears.

In certain embodiments, the dynamic information tag 130 includes projections 430 which extend across a front portion of the dynamic information tag 130. In certain embodiments, the projections provide an additional place via which a user may pull out the dynamic information tag 130 from the information handling system.

Figure 5B:
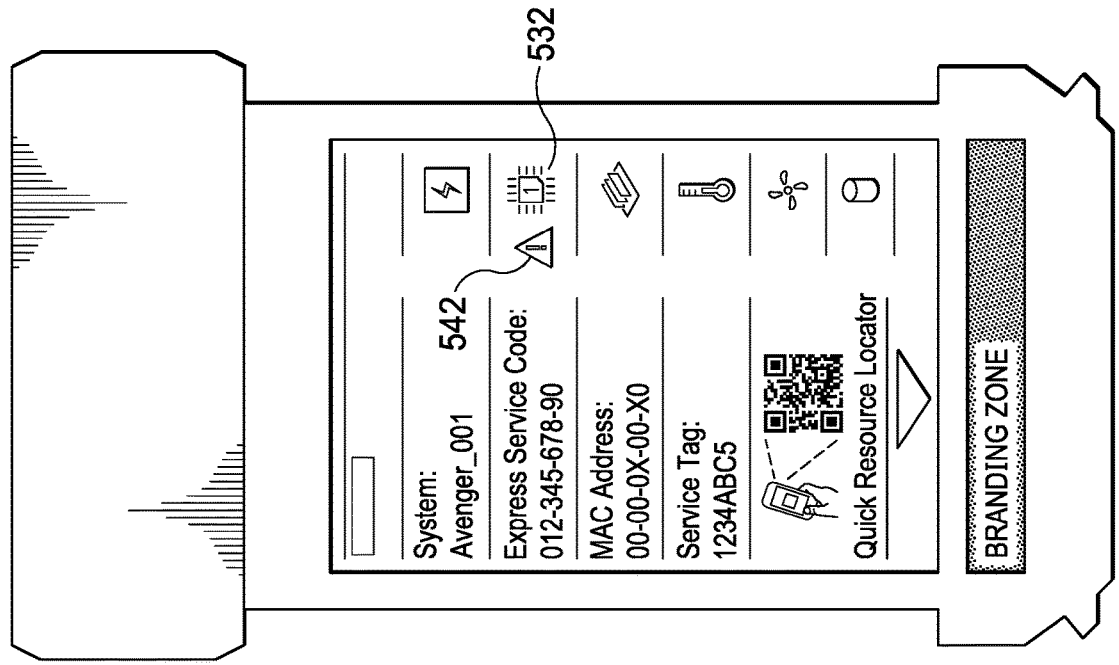
FIGS. 5A and 5B show top views of a dynamic information tag.
Figure 5A:
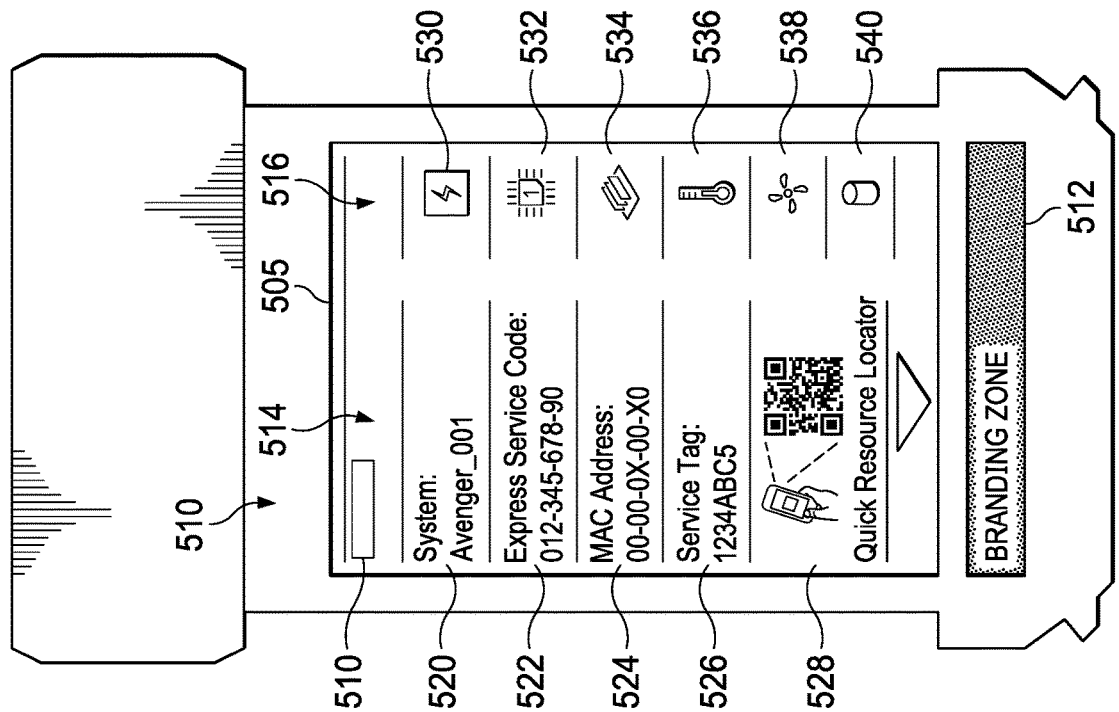

FIG. 5 shows a top view of a dynamic information tag 130. In certain embodiments, the dynamic information tag 130 includes a dynamic display 505. In certain embodiments, the dynamic display 505 is persistent such that content is displayed whether or not the display is connected to a control device and whether or not the display is powered. By utilizing persistent display technology, once the pixels of the display are set (e.g., during server configuration) the display continues to display the content whether or not the display is connected to a control device and whether or not the display is powered. In certain embodiments, the dynamic display comprises an electronic ink (e-ink) display. As used herein, an e-ink display may be defined as a low power (when compared to liquid crystal displays), paper-like display. In certain embodiments, the dynamic display 505 may be touch sensitive.

In certain embodiments, the dynamic display 505 presents a dynamic information tag user interface 510. In certain embodiments, the dynamic information tag 130 includes a dynamic branding portion 512. In certain embodiments, the dynamic branding portion 512 is presented via the dynamic display 505.

In certain embodiments, the dynamic branding portion 512 is accented by being physically separate from the dynamic information tag user interface. In certain embodiments, the dynamic branding portion 512 is accented by presenting the dynamic branding information in contrast with other information presented via the dynamic tag user interface 510. In certain embodiments, the contrast presents the information with inverted text and background shading relative to other information presented via the dynamic tag user interface 510. In certain embodiments, the dynamic branding portion is physically separated by an opening positioned over a dynamic branding portion display area. In certain embodiments, the opening is defined by the tag housing. In certain embodiments, the dynamic branding portion 512 presents one or more of system brand information and a system model number. Because this branding information is dynamic, should the information system be reconfigured (e.g., by upgrading a system processor or memory) the dynamic information tag 130 can update the dynamic branding portion to display one or more of a revised system brand information and a revised system model number. Providing such a dynamic branding portion allows a flexible branding solution which eliminates any need to procure/manage/install any additional parts to a shared architecture (such as a common compute framework) thus allowing for an entire portfolio of products to be delivered without the need to purchase branding badges etc. Providing such a dynamic branding portion enables OEM providers to re-brand hardware without the need to discard/replace existing branding solutions. Providing such a dynamic branding portion also facilitates sustainability as the need for molded brand badges/tags is reduced, thus reducing production material and shipping impacts.

In certain embodiments, the dynamic information tag user interface 510 includes a core content portion 514 and a monitoring icon portion 516. In certain embodiments, the core content portion 514 presents one or more of a customer unique system name, an express service code, a media access control (MAC) Address, a service tag and a scannable link such as a quantum resistant ledger (QRL) link. In certain embodiments, the scannable link provides access to service information such as service videos and technical publications. In certain embodiments, the scannable link accessed servicing instructions.

In certain embodiments, the monitoring icon portion 516 presents one or more monitoring icons 530, 532, 524, 526, 528, 540. In certain embodiments certain monitoring icons correspond to respective monitored information handling system systems or subsystems. In certain embodiments, a monitoring icon may be accented to indicate a system or subsystem fault (see e.g., FIG. 5B, icon 532). In certain embodiments, the monitoring icon may be persistently accented to display a failure mode associated with a component. In certain embodiments, the core content portion QRL link provides a link to more detailed support information associated with the indicated fault. In certain embodiments, the monitoring icon portion 516 can include a fault indication 542 associated with the system or subsystem fault. In certain embodiments, the service information can include one or more of error codes, warranty status, dynamic QRcode information. In certain embodiments, the user interface can present customizable error messages depending on system deployment. For example, a cloud supported type of implementation could present limited information to an end user whereas a premises based implementation could provide more detailed or customizable service information.

In certain embodiments, the dynamic information tag user interface 510 presents a navigation portion 550 (such as a navigation bar) to facilitate multi-screen navigation. Such multi-screen navigation is useful when viewing connected content such as servicing information via the dynamic information tag 130.

Figure 6:
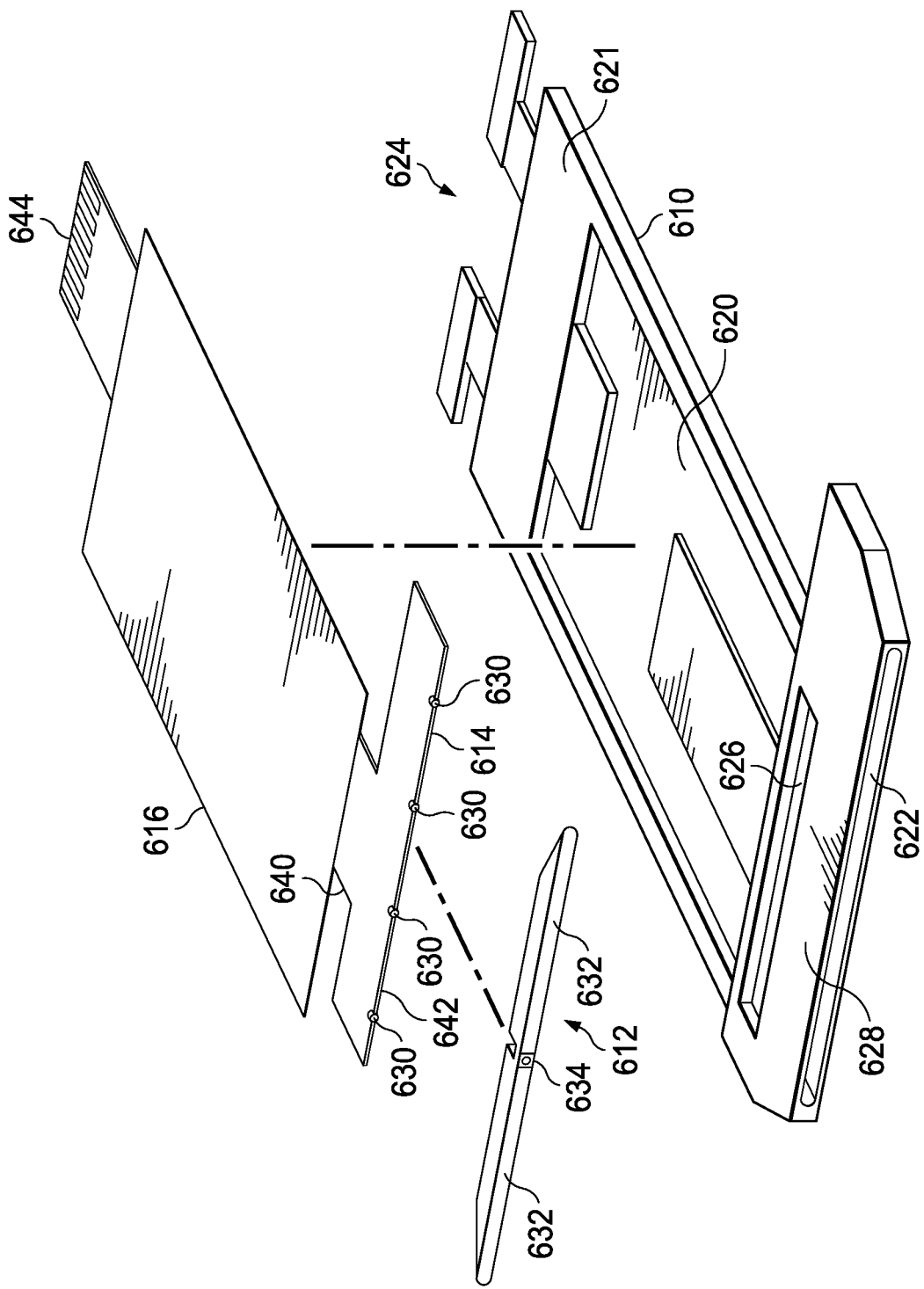
FIG. 6 shows an exploded view of a dynamic information tag.

FIG. 6 shows an exploded view of a dynamic information tag 130. More specifically, the dynamic information tag 130 includes one or more of a tag housing 610, an indicator portion 612, a control and connection portion 614 and a display 616. In certain embodiments, the tag housing 610 is sized to correspond to previous tag devices such that the dynamic information tag 130 fits within a previously designed recess of the information handling system. In certain embodiments, the tag housing includes a recessed area 620 in a main body portion 621 into which the display fits. In certain embodiments, the tag housing includes a slot 622 along its front edge into which the indicator portion 612 fits. In certain embodiments, the tag housing 610 includes a cable routing portion 624 which routes a rear portion of the control and connection portion 614 so that the control and connection portion 614 mates with a corresponding connector of the information handling system. In certain embodiments the tag housing 610 includes a branding opening 626. In certain embodiments, the branding opening is positioned across a front portion 628 of the tag housing 610. In certain embodiments, the front portion 628 of the tag housing 610 is horizontally wider than the main body portion 621 of the tag housing 610. In certain embodiments, the front portion of the tag housing defines a slot into which a portion of the display may be inserted. In certain embodiments, by inserting the display 616 into the slot of the housing, a portion of the display 616 may be used to present accented dynamic branding information.

In certain embodiments, the indicator portion 612 includes one or more light emitting diodes (LEDs) 630, a lens 632 and lens separation portion 634. In certain embodiments, the indicator portion 612 include four LEDs 630. In certain embodiments, the LEDs may be provided in a plurality of densities (e.g., 2, 4, 6, 8, etc.). In certain embodiments, the LEDs 630 are edge mounted. In certain embodiments, one or more LEDs 630 are red green blue (RGB) type LEDs. In certain embodiments, the LEDs 630 enable provision of multi-behavior indications. In certain embodiments, the LEDs 630 can provide behavior indications by varying one or more of colors, intensity and blink patterns. In certain embodiments, certain lenses 632 may be associated with particular LEDs 632. In certain embodiments, two LEDs 630 are associated with a first lens 632 and two LEDs 630 are associated with a second lens 632. In certain embodiments, the lenses 632 are diffuser lenses.

In certain embodiments, the control and connection portion 614 includes one or more of a flexible membrane board 640, an indicator connector 642 and a system connector 644. In certain embodiments, the flexible membrane board 640 provides flexibility to the dynamic information tag such that a user can flex the tag to view presented information when a server is located in various hard to reach portions of a rack. The flexibility also facilitates packaging of the indicator portion 612 into the slot 622 of the tag housing 610. In certain embodiments the system connector 644 provides a communication path to interact with the dynamic information tag control system 118. In certain embodiments, the control and connection portion 614 includes logic to enable platform identifiers per factory configurations to be presented. In certain embodiments, the flexible membrane board 640 of the control and connection portion 614 controls the display 616. In certain embodiments, the control and connection portion 614 is fixed such that the dynamic information tag 130 disconnects from the information handling system when in its extended configuration. In certain embodiments, the control and connection portion 614 is extendable such that the dynamic information tag 130 remains connected to the information handling system when in its extended configuration.

In certain embodiments, the display 616 comprises a persistent display. In certain embodiments, the display comprises a touch sensitive display. In certain embodiments, the display comprises an e-ink display. In certain embodiments, the display 616 is controlled to present fixed content. In certain embodiments, the fixed content includes branding content such as platform name content and platform identifier content. In certain embodiments, the display 616 is controlled to present dynamic content such as presenting a scrollable region for content including, but not limited to self-service information, platform specific internet protocol or MAC address, warranty information, etc.

FIGS. 7A, 7B and 7C show respective perspective views of a plurality of dynamic information tag form factors. The dynamic information tag 130 may be configured according to a plurality of different from factors. By providing the dynamic information tag in a plurality of form factors, the dynamic information tag 130 may be used with information handling systems having different sized tag recesses. More specifically, FIG. 7A shows a dynamic information tag 710 conforming to a system tag form factor. FIG. 7B shows a dynamic information tag 720 conforming to a node tag form factor. FIG. 7C shows a dynamic information tag 730 conforming to a mini tag form factor.

In certain embodiments, the dynamic information tag 710 provides platform/enclosure information including model number, service numbers and dynamic QRL web content, as well as other platform information. In certain embodiments, the dynamic information tag 720 provides node information including model number (if applicable), service numbers and dynamic QRL web content, and as well as other applicable node information. In certain embodiments, the dynamic information tag 730 provides node information including model number (if applicable), service numbers and dynamic QRL web content, and as well as other applicable node information.

Figure 8:
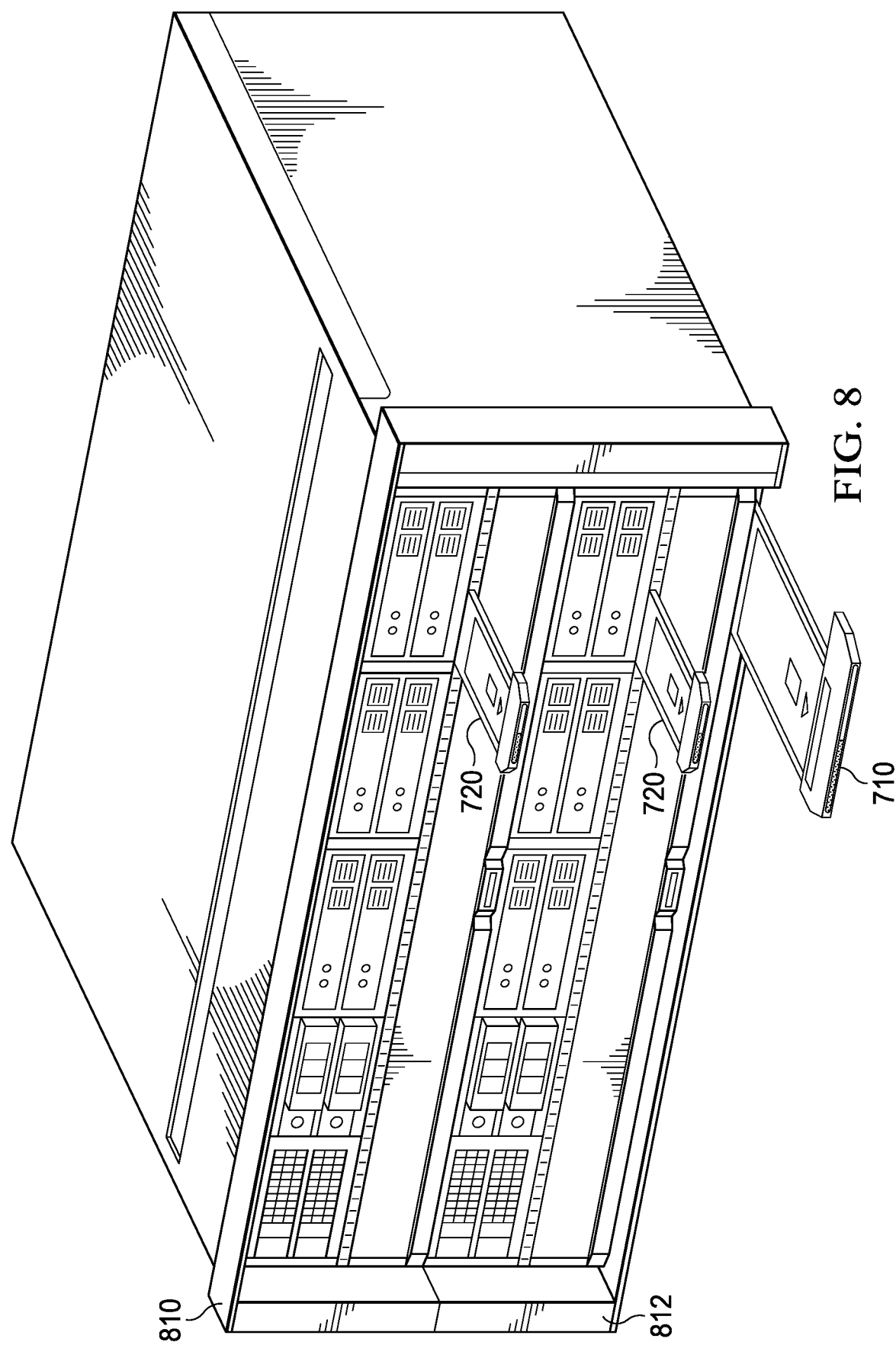
FIG. 8 shows a perspective view of a plurality of information handling systems having dynamic information tags in extended configurations.

FIG. 8 shows a perspective view of a plurality of information handling systems 810, 812 having dynamic information tags in extended configurations. More specifically, the plurality of information handling systems 810, 812 may be part of a multi-node implementation which include a plurality of dynamic information tags such as a dynamic information tag 710 which corresponds to the system tag form factor and dynamic information tags 720, 720 which correspond to the node tag form factor. In certain embodiments, the plurality of dynamic information tags function as zero footprint status indicators as these indicators do not take up any additional footprint across the front of the multi-node implementation.

Figure 9:
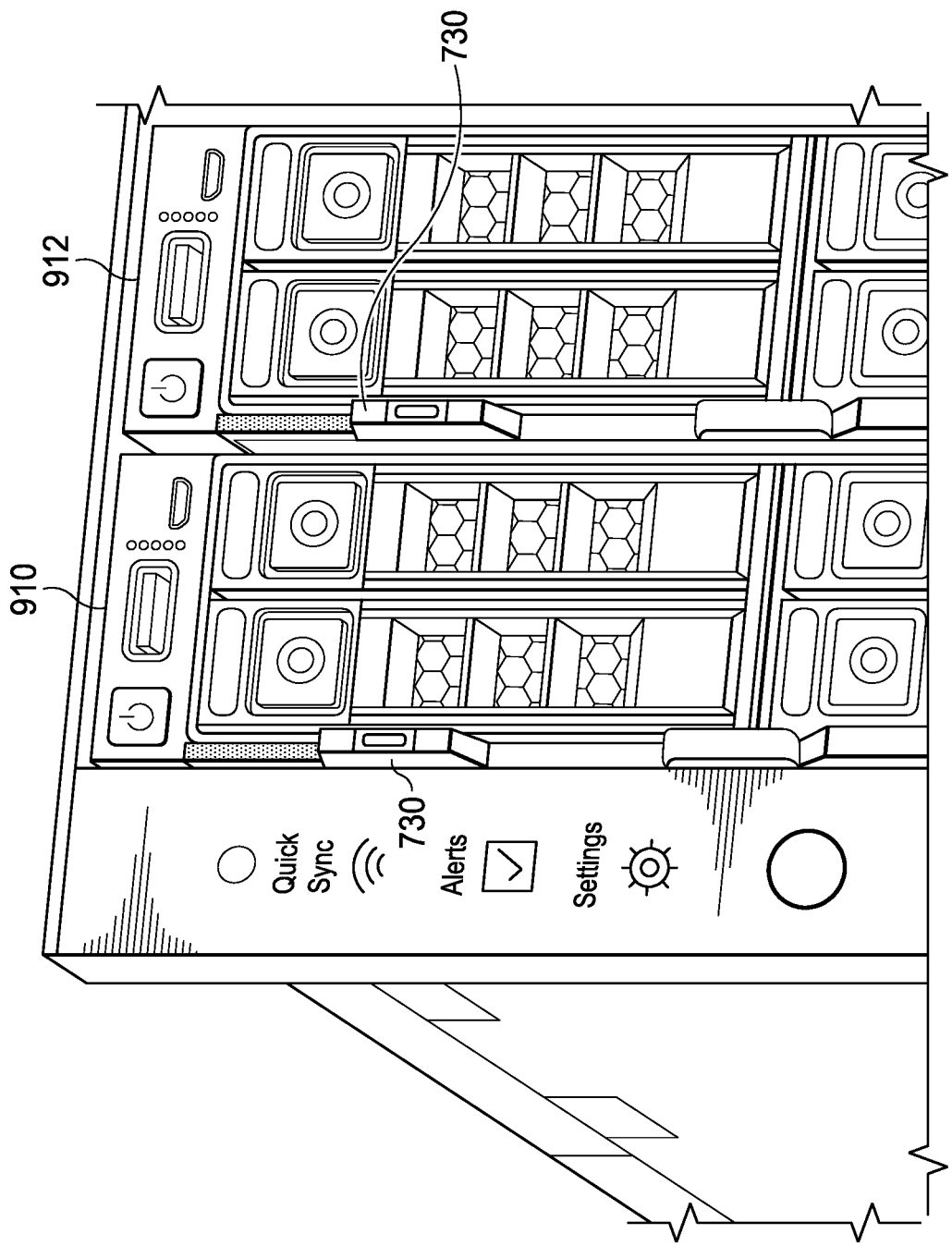
FIG. 9 shows a perspective view of an information handling system having a dynamic information tag.
Figure 12B:
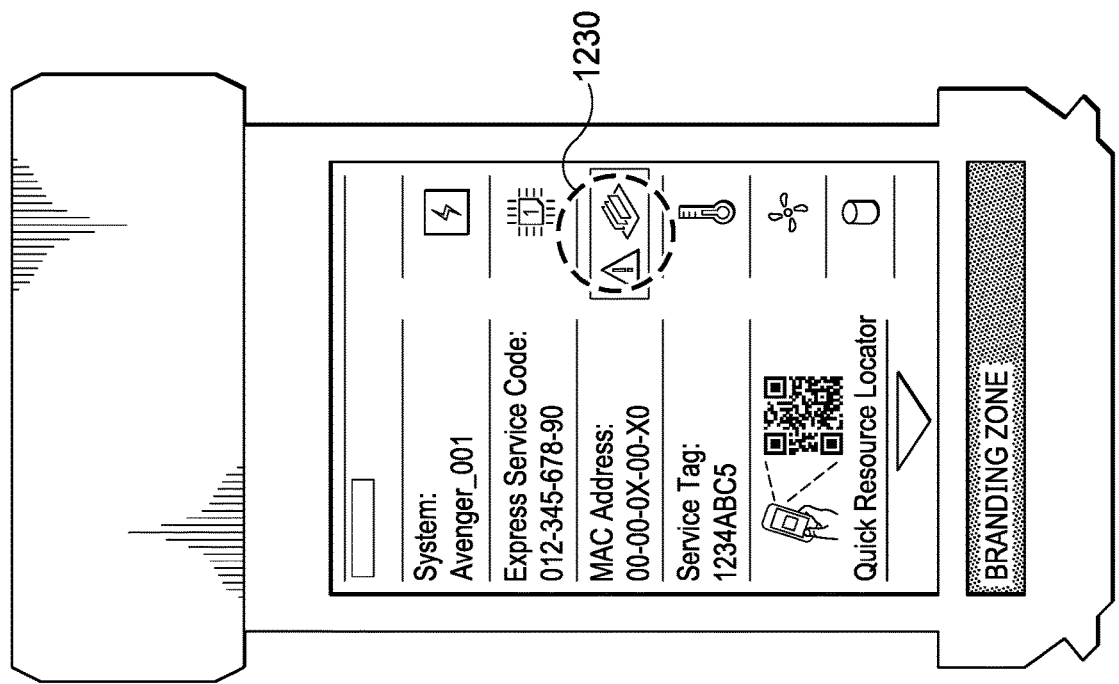
FIGS. 12A, 12B, 12C, 12D and 12E show a sequence of instructional information presented via a dynamic information tag.
Figure 12A:
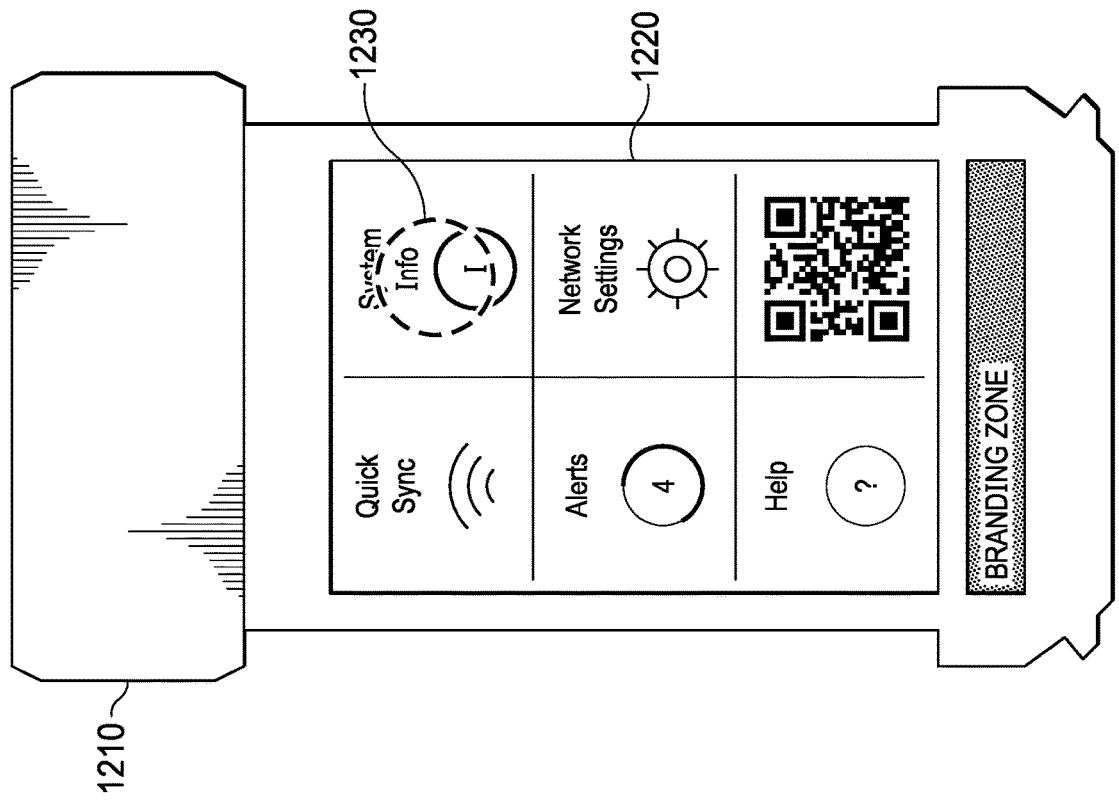
Figure 12D:
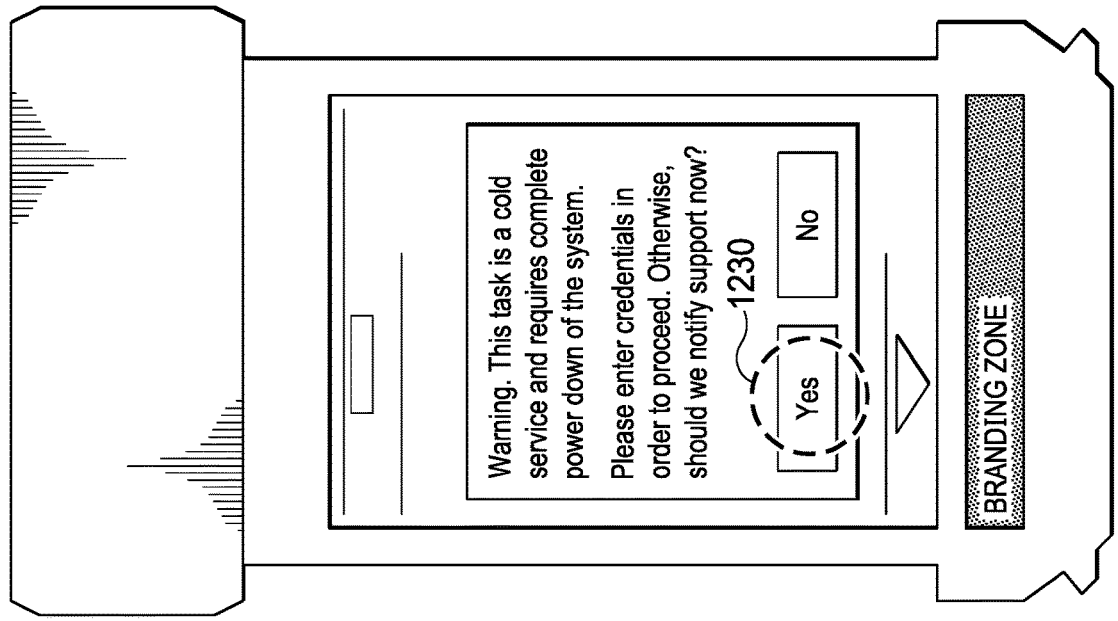
Figure 12C:
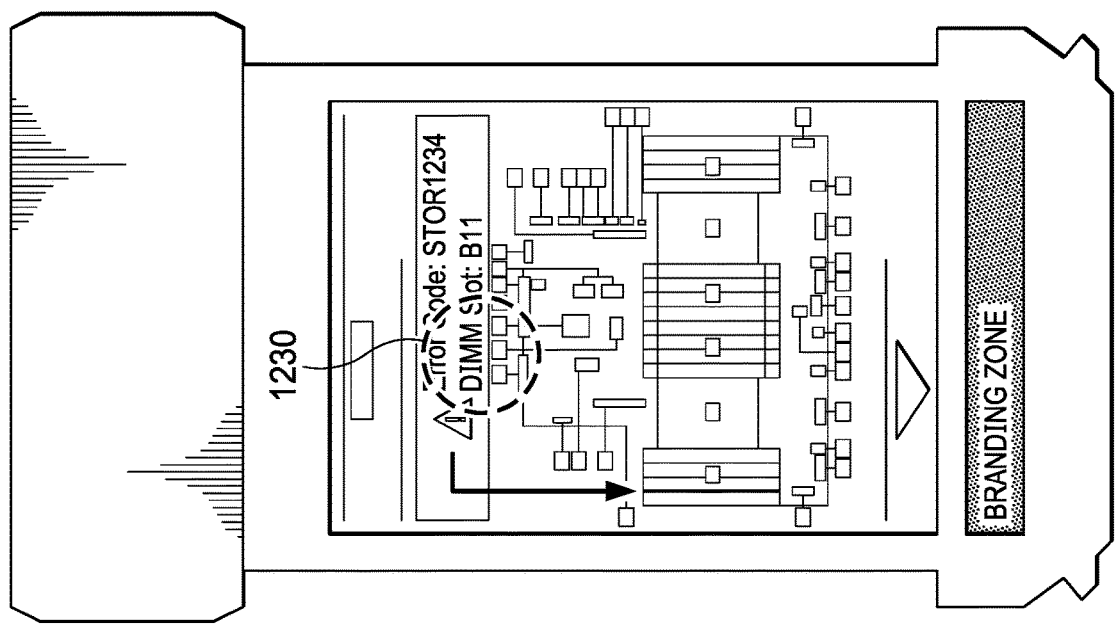
Figure 12E:
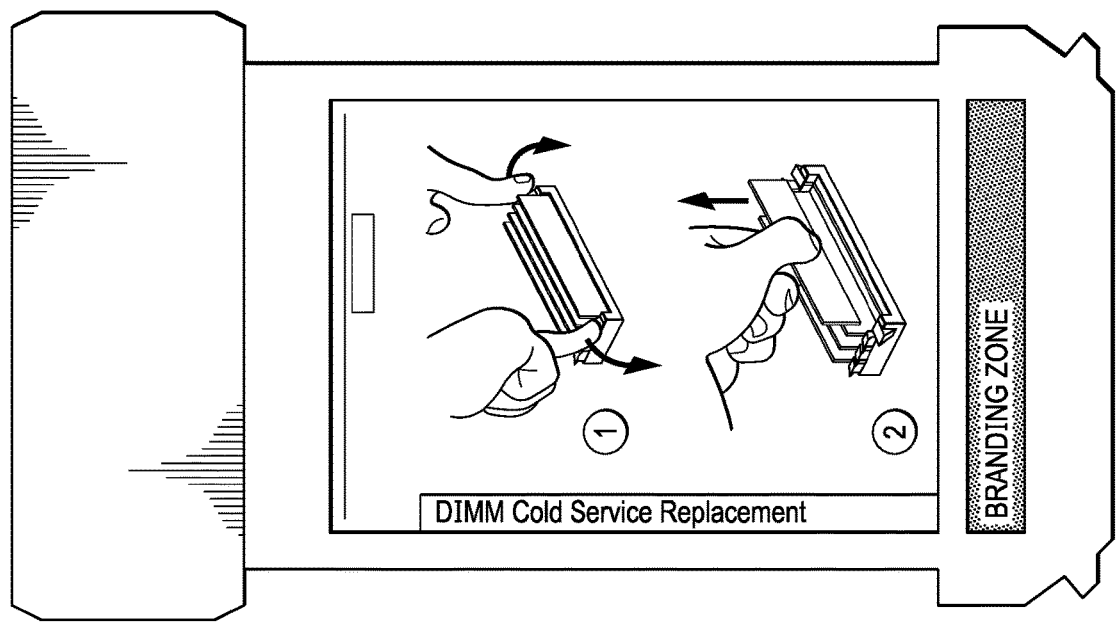
Figure 13A:
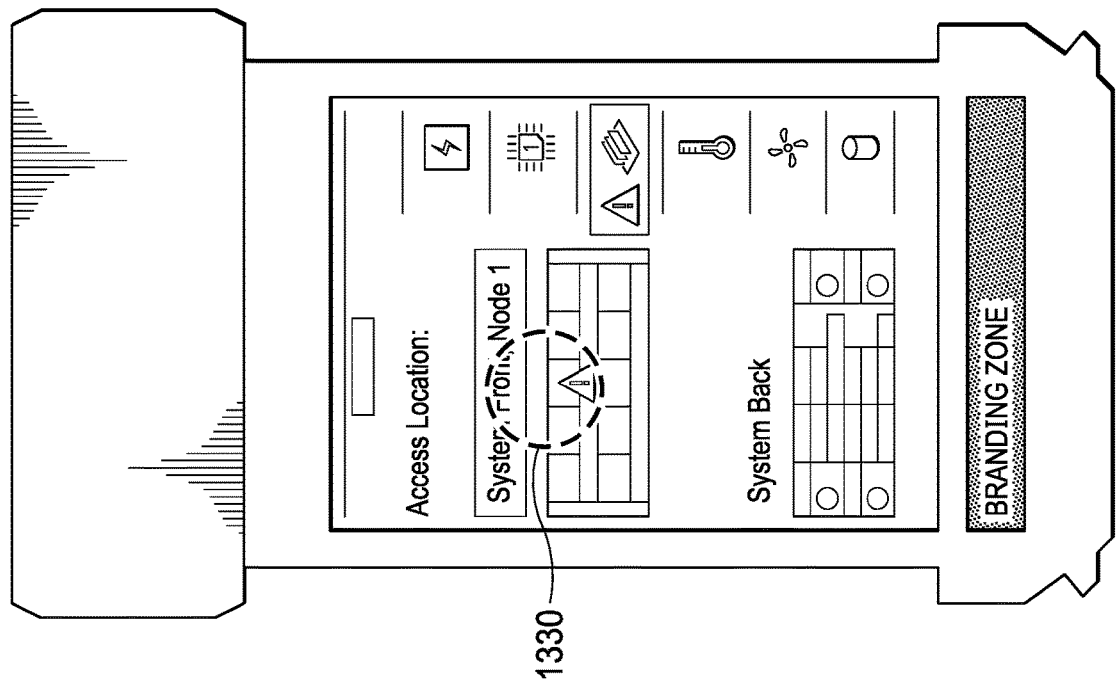
FIGS. 13A, 13B, 13C, 13D and 13E show another sequence of instructional information presented via a dynamic information tag.
Figure 13B:
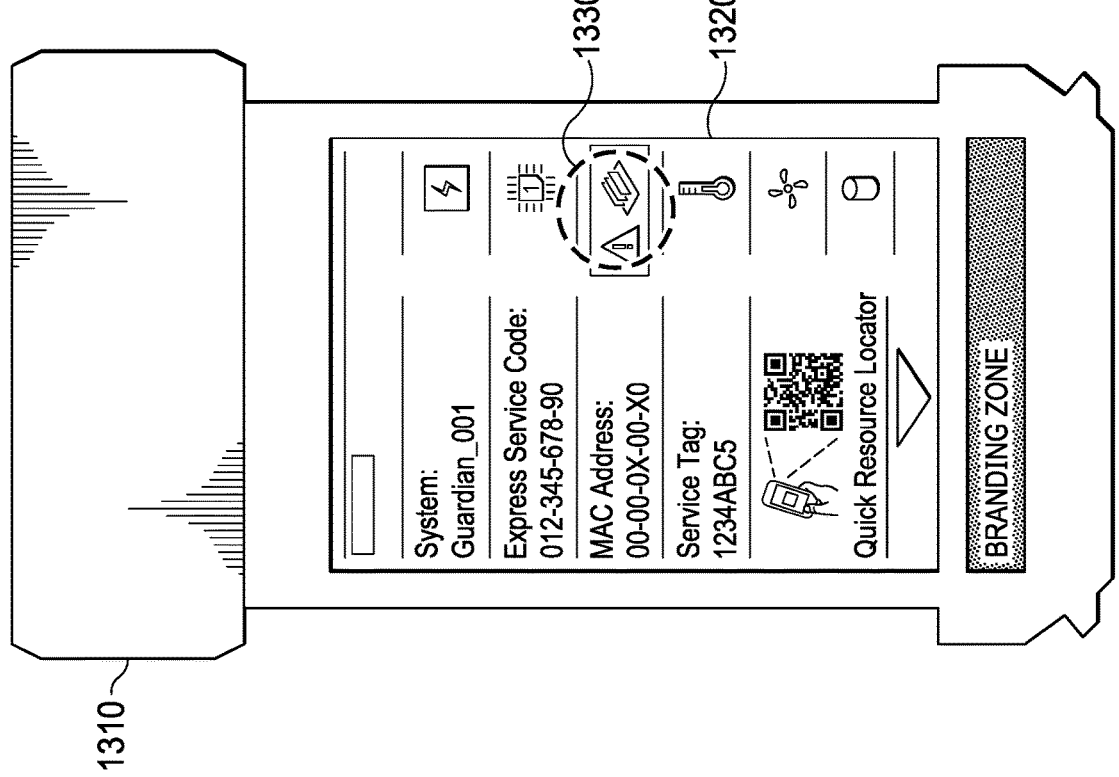
Figure 13D:
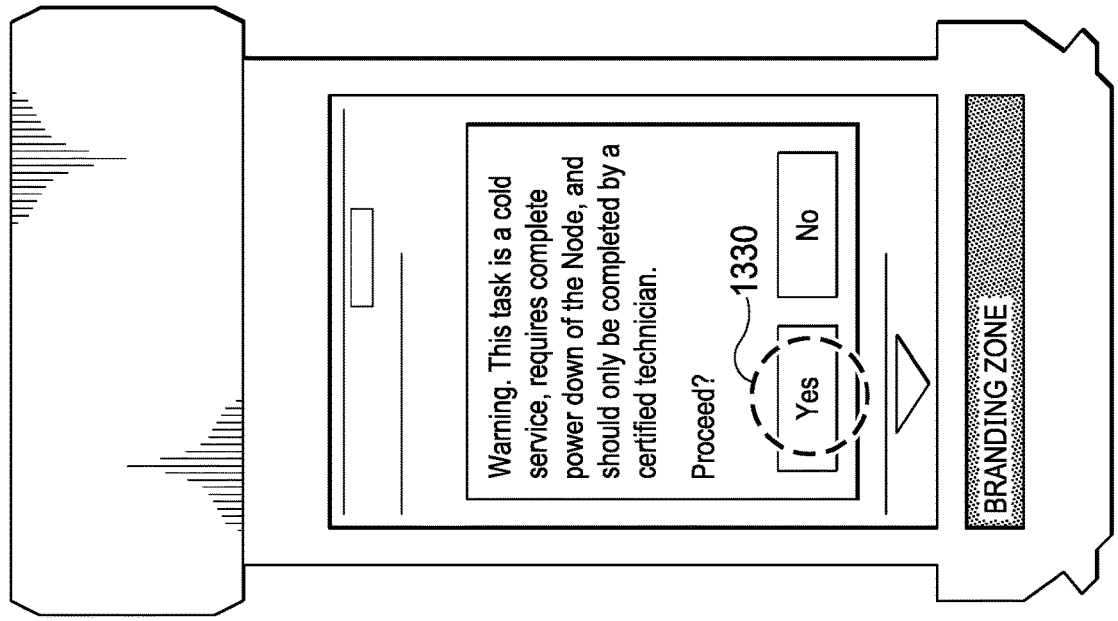
Figure 13C:
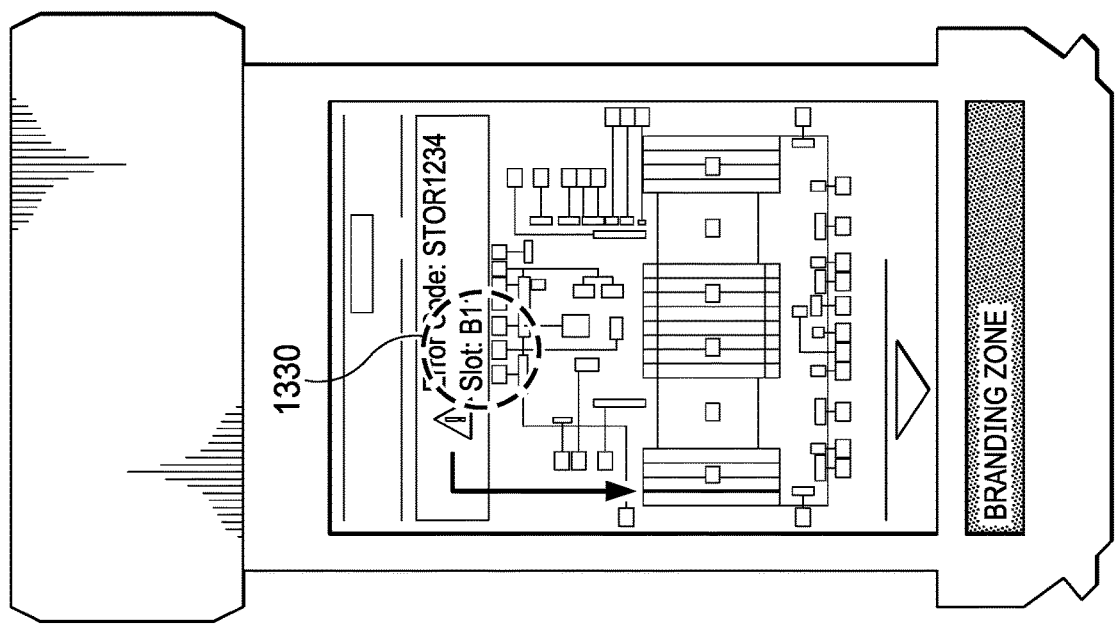
Figure 13E:
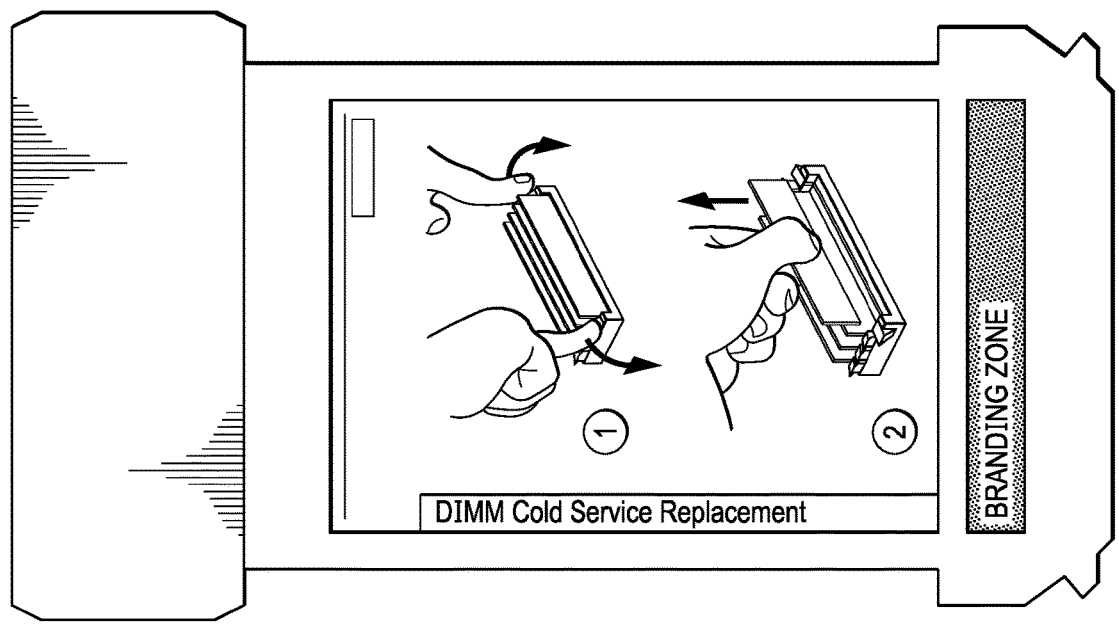
Figure 14B:
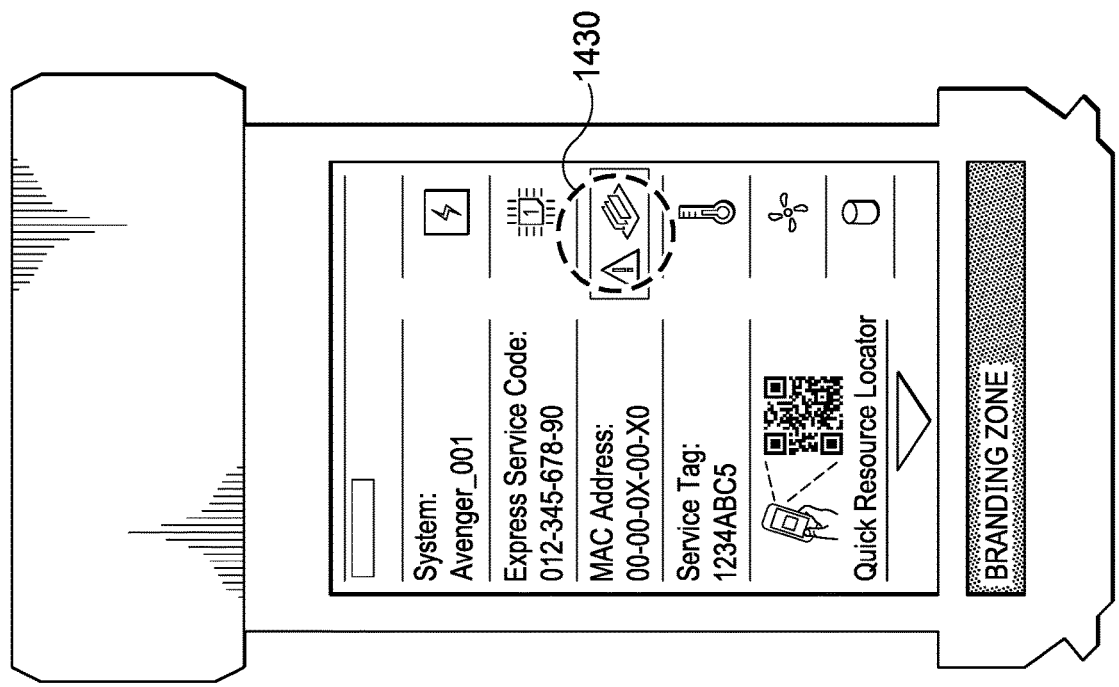
FIGS. 14A, 14B, 14C, 14D and 14E show another sequence of instructional information presented via a dynamic information tag.
Figure 14A:
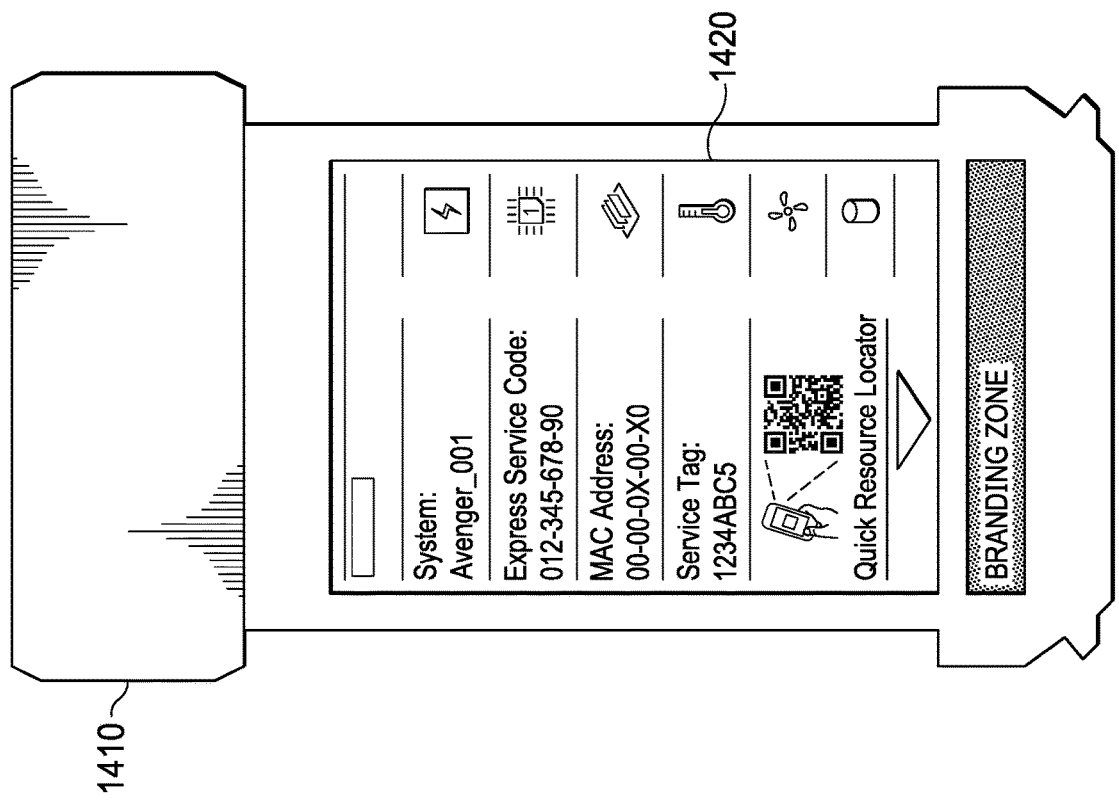
Figure 14C:
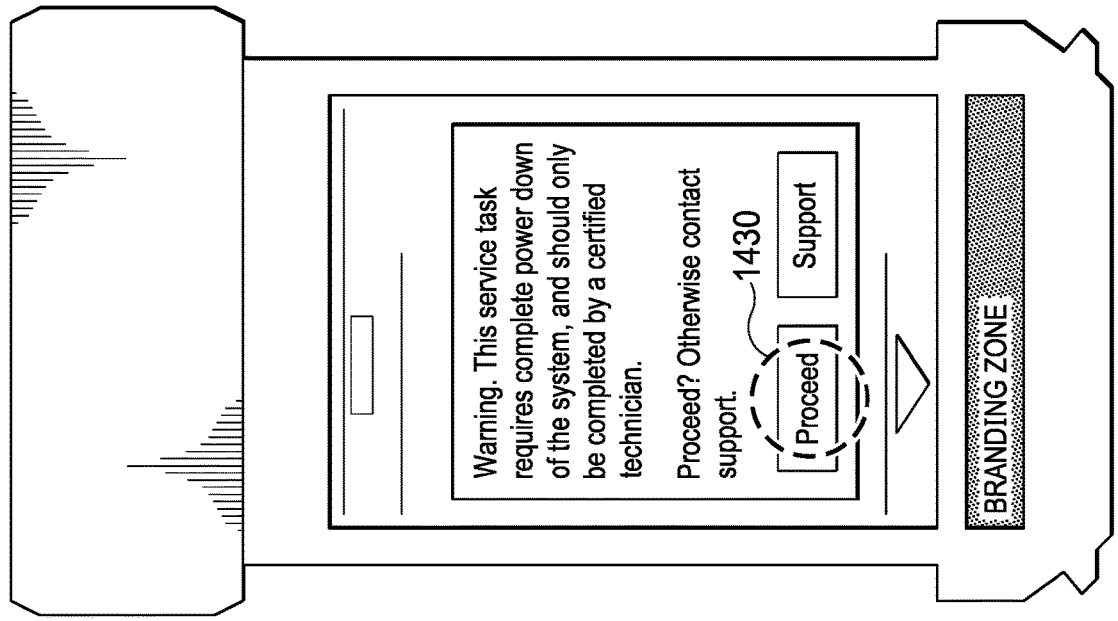
Figure 14D:
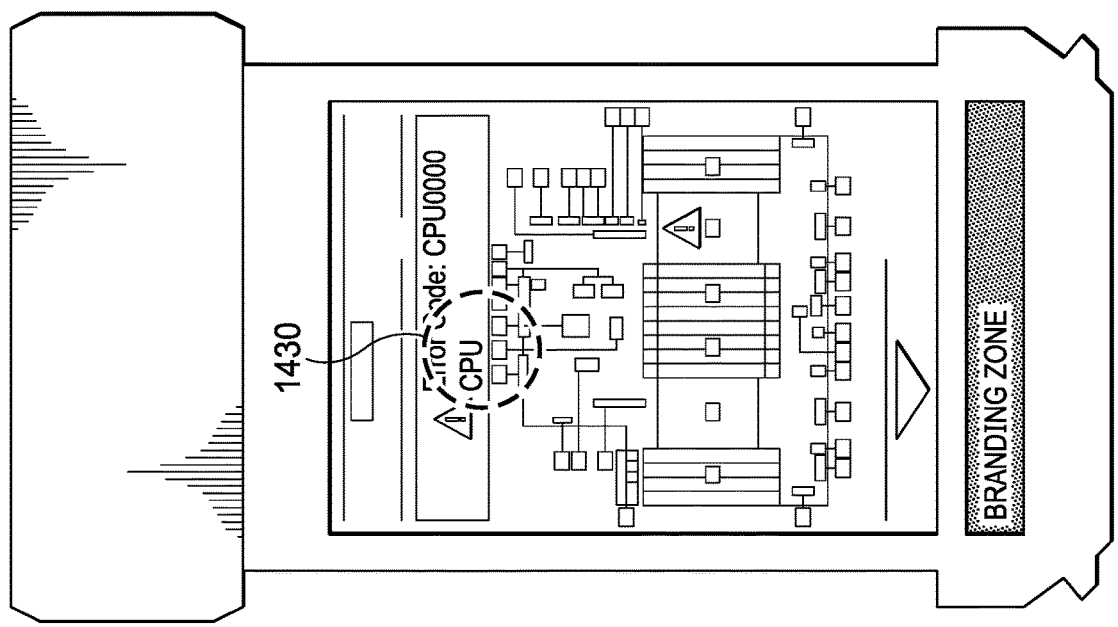
Figure 14E:
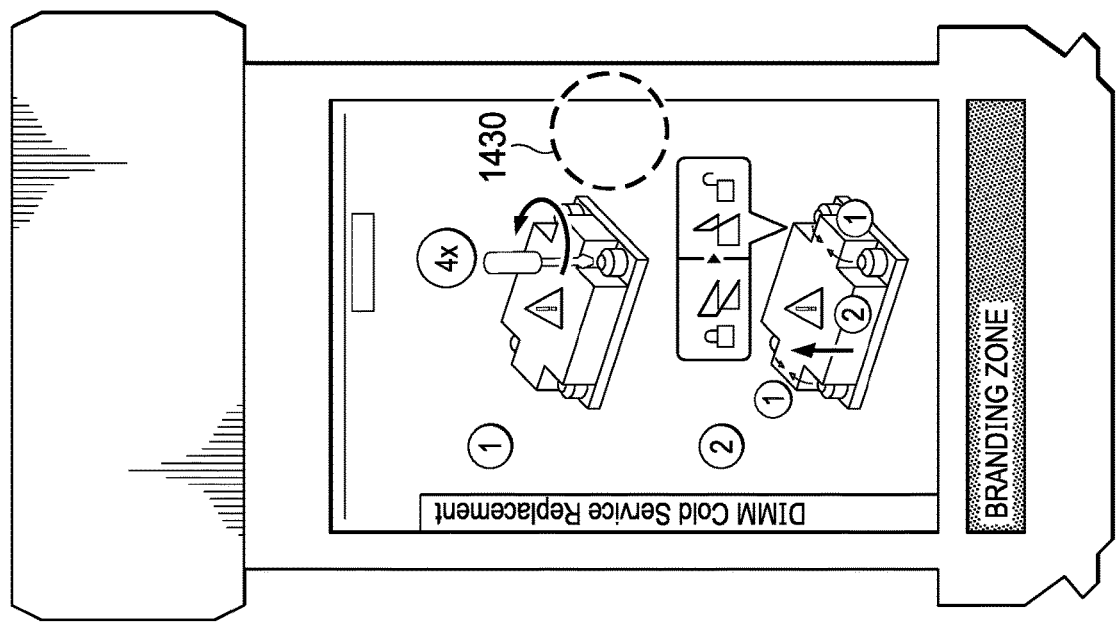

FIG. 9 shows a perspective view of a plurality of storage type information handling systems having respective dynamic information tags. More specifically, each storage type information handling system 910, 912 may have a respective dynamic information tag such as a dynamic information tag 730 which corresponds to the mini tag form factor. In certain embodiments, the dynamic information tag may be mounted in a vertical orientation to correspond to vertically mounted information handling system components.

FIG. 10 shows a front view of a plurality of behavior indicators presented via a dynamic information tag. More specifically, in certain embodiments, the behavior indicator may be presented as a single continuous behavior indicator (see e.g., behavior indicator 1010). In certain embodiments, the single continuous behavior indicator 1010 is presented for systems that do not conform to an indictor protocol such as a quick sync 2 protocol. In certain embodiments, the behavior indicator may be presented as a plurality of separate (e.g., two separate) behavior indicators (see e.g., behavior indicator 1020). In certain embodiments, the single continuous behavior indicator 1010 is presented for systems that conform to an indictor protocol such as a protocol which enables at the system management via a user device. In certain embodiments, the protocol may be Bluetooth low energy (BLE) or WiFi enabled, or a combination thereof.

FIGS. 11A and 11B show tables of a plurality of behavior indicators presented via a dynamic information tag. More specifically, FIG. 11A shows examples of a plurality of behavior indications which may be presented via the behavior indication portion 320. FIG. 11B shows examples of enhanced behavior indications which may be presented via the behavior indication portion 320. In certain embodiments, the enhanced behavior indications may be presented as cycles of the behavior indication portion 320 (e.g., by various blinking patterns).

FIGS. 12A, 12B, 12C, 12D and 12E show a sequence of instructional information presented via a dynamic information tag 1210. In certain embodiments, the sequence of instruction information may be considered service information. In certain embodiments, the dynamic information tag presents a dynamic information tag user interface 1220 when the dynamic information tag 1210 is in its extended orientation. This dynamic information tag user interface 1220 presents a step by step series of service instructions to instruct a user how to perform a particular service task. In certain embodiments, the instructions may include animated representation of performance of a particular task (see e.g., FIG. 12E). In certain embodiments, the user actuates a particular portion of the dynamic information tag user interface (e.g., portion 1230) to move from one screen presentation of the dynamic information tag user interface to a next screen presentation of the dynamic information tag user interface. In certain embodiments, the dynamic information tag user interface is situation aware such that an error occurs, the user interface will automatically flip through a storybook sequence of steps needed to resolve the issue.

By providing such a step by step animation, printed guides and labels are not necessary. Elimination of System information labels on chassis offers a plurality of benefits including a saving hard cost associated with installing labels, saving material cost of manufacturing labels, improving sustainability as fewer physical part numbers and their associated materials are used in the system. Additionally, such an animated user interface is more agile as the user interface can be modified should its associated system be repurposed.

FIGS. 13A, 13B, 13C, 13D and 13E show another sequence of instructional information presented via a dynamic information tag. In certain embodiments, the sequence of instruction information may be considered service information. In certain embodiments, the dynamic information tag presents a dynamic information tag user interface 1320 when the dynamic information tag 1310 is in its extended orientation. This dynamic information tag user interface 1320 presents a step by step series of service instructions to instruct a user how to perform a particular service task. In certain embodiments, the instructions may include animated representation of performance of a particular task (see e.g., FIG. 13E). In certain embodiments, the user actuates a particular portion of the dynamic information tag user interface (e.g., portion 1330) to move from one screen presentation of the dynamic information tag user interface to a next screen presentation of the dynamic information tag user interface. In certain embodiments, the dynamic information tag user interface is situation aware such that an error occurs, the user interface will automatically flip through a storybook sequence of steps needed to resolve the issue.

FIGS. 14A, 14B, 14C, 14D and 14E show another sequence of instructional information presented via a dynamic information tag. In certain embodiments, the sequence of instruction information may be considered service information. In certain embodiments, the dynamic information tag presents a dynamic information tag user interface 1420 when the dynamic information tag 1410 is in its extended orientation. This dynamic information tag user interface 1420 presents a step by step series of service instructions to instruct a user how to perform a particular service task. In certain embodiments, the instructions may include animated representation of performance of a particular task (see e.g., FIG. 14E). In certain embodiments, the user actuates a particular portion of the dynamic information tag user interface (e.g., portion 1430) to move from one screen presentation of the dynamic information tag user interface to a next screen presentation of the dynamic information tag user interface. In certain embodiments, the dynamic information tag user interface is situation aware such that an error occurs, the user interface will automatically flip through a storybook sequence of steps needed to resolve the issue.

As will be appreciated by one skilled in the art, the present invention may be embodied as a method, system, or computer program product. Accordingly, embodiments of the invention may be implemented entirely in hardware, entirely in software (including firmware, resident software, microcode, etc.) or in an embodiment combining software and hardware. These various embodiments may all generally be referred to herein as a "circuit," "module," or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example, but not limited to, an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. In the context of this document, a computer-usable or computer-readable medium may be any medium that can contain, store, communicate, or transport the program for use by or in connection with the instruction execution system, apparatus, or device.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a standalone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

Embodiments of the invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A dynamic information tag for dynamically presenting information comprising:
   a tag housing, the tag housing being sized to fit within a recess of an information handling system configured for receipt of a static information tag;
   a control and connection portion; and,
   a display coupled to the control and connection portion, the display being controlled via the control and connection portion to present information handling system information; and wherein the control and connection portion comprises a flexible membrane board and a connector, the connector coupling the control and connection portion to the information handling system.

2. The method of claim 1, further comprising:

a behavior indicator portion mounted to a front portion of the tag housing and coupled to the control and connection portion, the behavior indicator portion being visible when the tag housing is in a closed position relative to the information handling system.

3. The method of claim 2, wherein:

the behavior indicator portion comprises a light emitting diode (LED), the LED being controlled to provide behavior indicators for the information handling system.

4. The method of claim 1, wherein:

the tag housing conforms to one of a plurality of form factors, the plurality of form factors comprising a system tag form factor, a node tag form factor and a mini tag form factor.

5. The method of claim 1, wherein:

the display comprises a persistent display.

6. A system comprising:

a processor;

a data bus coupled to the processor; and a dynamic information tag, the dynamic information tag comprising a tag housing, the tag housing being sized to fit within a recess of an information handling system configured for receipt of a static information tag;

a control and connection portion; and, a display coupled to the control and connection portion, the display being controlled via the control and connection portion to present information handling system information; and wherein the control and connection portion comprises a flexible membrane board and a connector, the connector coupling the control and connection portion to the information handling system.

7. The system of claim 6, further comprising:

a behavior indicator portion mounted to a front portion of the tag housing and coupled to the control and connection portion, the behavior indicator portion being visible when the tag housing is in a closed position relative to the information handling system.

8. The system of claim 7, wherein:

the behavior indicator portion comprises a light emitting diode (LED), the LED being controlled to provide behavior indicators for the information handling system.

9. The system of claim 6, wherein:

the tag housing conforms to one of a plurality of form factors, the plurality of form factors comprising a system tag form factor, a node tag form factor and a mini tag form factor.

10. The system of claim 9, wherein:

the display comprises a persistent display.

\* \* \* \* \*